United States Patent
Shimatani

(10) Patent No.: US 8,363,045 B2
(45) Date of Patent: Jan. 29, 2013

(54) CLASS AB AMPLIFIER CIRCUIT AND DISPLAY APPARATUS

(75) Inventor: Atsushi Shimatani, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 826 days.

(21) Appl. No.: 12/461,162

(22) Filed: Aug. 3, 2009

(65) Prior Publication Data

US 2010/0033464 A1  Feb. 11, 2010

(30) Foreign Application Priority Data

Aug. 5, 2008  (JP) .................................. 2008-201925

(51) Int. Cl.
- G06F 3/038 (2006.01)
- G09G 5/00 (2006.01)
- H03F 1/02 (2006.01)
- H03F 3/45 (2006.01)

(52) U.S. Cl. ............. 345/211; 330/9; 330/255; 330/257

(58) Field of Classification Search .................. 345/211; 330/257

See application file for complete search history.

(56) References Cited

U.S. PATENT DOCUMENTS

| 5,311,145 | A  | 5/1994 | Huijsing et al. |
| 7,170,351 | B2 | 1/2007 | Shimatani |
| 7,330,074 | B2 | 2/2008 | Kang et al. |
| 2005/0017809 | A1* | 1/2005 | Ueno ............................ 330/255 |
| 2006/0066400 | A1* | 3/2006 | Kang et al. ................... 330/255 |
| 2006/0255856 | A1* | 11/2006 | Nishimura ........................ 330/9 |

FOREIGN PATENT DOCUMENTS

| CN | 1607564 (A) | 4/2005 |
| JP | 6-326529 A | 11/1994 |
| JP | 2005-33780 A | 2/2005 |
| JP | 2005-124120 A | 5/2005 |
| JP | 2006-94533 A | 4/2006 |

OTHER PUBLICATIONS

Notification of Reason(s) for Refusal dated Mar. 9, 2012, with English translation.
Chinese Office Action dated Jul. 11, 2012, with partial English transaltion.

* cited by examiner

*Primary Examiner* — Sumati Lefkowitz
*Assistant Examiner* — Charles V Hicks
(74) *Attorney, Agent, or Firm* — McGinn IP Law Group, PLLC

(57) ABSTRACT

In a class AB amplifier circuit, an input stage circuit includes a first differential pair configured to receive a differential signal and a first current mirror circuit connected with the first differential pair through a first node. A middle stage circuit includes a floating constant current source connected with the first node, a first transistor whose gate is applied with a bias voltage, and a first constant current source connected with the first node through the first transistor. A last stage circuit includes a first output stage transistor whose gate is connected with the first node and which controls a voltage of an output terminal. A first phase compensation capacitance has one end connected with a first connection node between the first constant current source and the first transistor and the other end connected with the output terminal.

14 Claims, 10 Drawing Sheets

US 8,363,045 B2

CLASS AB AMPLIFIER CIRCUIT AND DISPLAY APPARATUS

INCORPORATION BY REFERENCE

This patent application claims a priority on convention based on Japanese Patent Application No. 2008-201925. The disclosure thereof is incorporated herein by reference.

BACKGROUND OF THE INVENTION

1. Field of the Invention

The present invention is related to a class "AB" amplifier circuit and a display apparatus including a display panel which is driven by a class AB amplifier circuit.

2. Description of Related Art

As one of the application fields of a class AB amplifier circuit, there is known TFT_LCD (Thin Film Transistor_Liquid Crystal Display) driver LSI (hereinafter, to be referred to as a liquid crystal driver). The class AB amplifier circuit for a liquid crystal driver drives capacitive loads (pixel capacitances) provided for a liquid crystal panel. Such a class AB amplifier circuit is required to have a low consumption current amount and to be able to charge and discharge the capacitive load at high speed.

In recent years, a large-sized TFT_LCD panel of 42 inches or more for a TV needs to be drive by the class AB amplifier circuit arises. The large-sized TFT_LCD panel is large in load capacitance and high in a drive frequency. Also, because a current consumption amount increases as the drive speed increases, heat generation in a chip sometimes becomes a problem. From the above reasons, the class AB amplifier circuit for the liquid crystal driver needs to be possible to increase the drive speed and to have a low current consumption amount.

Moreover, in recent years, as the price of the TFT_LCD panel falls, the cost reduction of the liquid crystal driver is required. As an effective measure of the reduction in cost of the liquid crystal driver, it could be considered to shrink the chip size of the driver. A plurality of class AB amplifier circuits (e.g. 400 to 700 circuits) connected in a voltage follower configuration are provided for a buffer circuit in the liquid crystal driver. That is, an occupation rate of the class AB amplifier circuits in the liquid crystal driver is high. Therefore, the shrinkage in the chip size of the class AB amplifier circuit is a key of the chip shrinkage of the liquid crystal driver.

In Japanese Patent Application Publication (JP 2005-124120A: first conventional example), a class AB amplifier circuit is described which is used for the liquid crystal driver and which has a low current consumption amount. FIG. 1 is a circuit diagram showing a configuration of the class AB amplifier circuit described in the first conventional example. This class AB amplifier circuit is so-called Rail-to-Rail amplifier.

Referring to FIG. 1, the class AB amplifier circuit includes an input stage circuit 10 which receives signals INP and INM, which are complementary signals, a middle stage circuit 20 which is connected with the input stage circuit 10 through nodes N1 and N2, and a last stage circuit 30 which is connected with the middle stage circuit 20 through nodes N3 and N4 and outputs an output signal OUT.

The input stage circuit 10 includes a differential circuit 101 which outputs an output to the node N1 in accordance to the input signals INP and INM, and a differential circuit 102 which outputs an output to the node N2 in accordance with the input signals INP and INM. The differential circuit 101 includes an N-channel MOS transistor MN11 and an N-channel MOS transistor MN12, which form a differential pair. The differential circuit 102 includes a P-channel MOS transistor MP11 and a P-channel MOS transistor MP12, which form a differential pair. By such configuration, the differential circuit 102 operates in an input voltage range in which the differential circuit 101 does not operate, and the differential circuit 101 operates in an input voltage range in which the differential circuit 102 does not operate. Thus, a differential stage operating in the whole input voltage range can be obtained. That is, the class AB amplifier circuit in the first conventional example realizes the Rail-to-Rail configuration.

Hereinafter, the configuration and operation of the class AB amplifier circuit will be described below. At first, the configuration of the differential circuit 101 will be described. The N-channel MOS transistor MN11 and the N-channel MOS transistor MN12 form a first differential pair to have their sources connected in common. The N-channel MOS transistor MN15 is connected between the first differential pair and a negative power supply (the power supply of a low voltage side) VSS. In detailed, a source of the N-channel MOS transistor MN15 is connected with the negative power supply VSS, a drain thereof is connected with the sources of the N-channel MOS transistor MN11 and the N-channel MOS transistor MN12 in common and a gate thereof is connected with a constant voltage source terminal BN11. A bias voltage (the constant voltage) is supplied to the constant voltage source terminal BN11 and the N-channel MOS transistor MN15 functions as a constant current source. The differential circuit 101 further includes P-channel MOS transistors MP13 and MP14. Sources of the P-channel MOS transistor MP13 and the P-channel MOS transistor MP14 are connected with a positive power supply (the power supply of a high voltage side) VDD in common. A drain and gate of the P-channel MOS transistor MP13, and a gate of the P-channel MOS transistor MP14 are connected with the drain of the N-channel MOS transistor MN11 in common. A drain of the P-channel MOS transistor MP14 and the drain of the N-channel MOS transistor MN12 are connected with node N1 in common.

Next, the configuration of the differential circuit 102 will be described. The P-channel MOS transistor MP11 and the P-channel MOS transistor MP12 form a second differential pair to have their sources connected in common. The P-channel MOS transistor MP15 is connected between a second differential pair and the positive power supply VDD. In detailed, the source of the P-channel MOS transistor MP15 is connected with the positive power supply VDD. A drain thereof is connected with the sources of the P-channel MOS transistor MP11 and the P-channel MOS transistor MP12 in common. A gate thereof is connected with a constant voltage source terminal BP11. A bias voltage (a constant voltage) is supplied to the constant voltage terminal BP11 and the P-channel MOS transistor MP15 functions as the constant current source. The differential circuit 102 further includes the N-channel MOS transistors MN13 and MN14. The differential circuit 102 further includes the P-channel MOS transistors MP11 and MP12 and. Sources of the N-channel MOS transistor MN13 and the N-channel MOS transistor MN14 are connected with the negative power supply VSS in common. A drain and gate of the N-channel MOS transistor MN13 and a gate of the N-channel MOS transistor MN14 are connected to have a drain of the P-channel MOS transistor MP11 in common. A drain of the N-channel MOS transistor MN14 and a drain of the P-channel MOS transistor MP12 are connected with the node N2 in common. A gate of the P-channel MOS transistor MP11 and a gate of the N-channel MOS transistor MN11 are connected with the input terminal INM in common. A gate of the P-channel MOS transistor MP12 and a gate of the N-channel MOS transistor MN12 are connected with the input terminal INP in common.

The middle stage circuit 20 includes an N-channel MOS transistor MN22 and a P-channel MOS transistor MP22 which function as a floating current source 201, a P-channel MOS transistor MP21 connected with the positive power supply VDD and functioning as a constant current source, and an N-channel MOS transistor MN21 connected with the negative power supply VSS and functioning as a constant current source. A gate of the P-channel MOS transistor MP22 is connected with a constant voltage source terminal BP22 to which a bias voltage is supplied. A source of the P-channel MOS transistor MP22 is connected with a drain of the N-channel MOS transistor MN22, a drain of the P-channel MOS transistor MP21, and nodes N1 and N3 in common. A drain of the P-channel MOS transistor MP22 is connected with a source of the N-channel MOS transistor MN22, a drain of the N-channel MOS transistor MN21, and nodes N2 and N4 in common. A gate of the N-channel MOS transistor MN22 is connected with a constant voltage source terminal BN22 to which a bias voltage is supplied. A source of the N-channel MOS transistor MN22 is connected with the drain of the P-channel MOS transistor MP22, the drain of the N-channel MOS transistor MN21, and the nodes N2 and N4 in common. The drain of the N-channel MOS transistor MN22 is connected with the source of the P-channel MOS transistor MP22, the drain of the P-channel MOS transistor MP21, and the nodes N1 and N3 in common.

The last stage circuit 30 is an AB class output stage in which an output OUT is controlled by the floating current source 201 in the middle stage circuit 20. The last stage circuit 30 includes a P-channel MOS transistor MP31 whose gate is connected with the floating current source 201 through the node N3, and an N-channel MOS transistor MN31 whose gate is connected with the floating current source 201 through the node N4. A source of the P-channel MOS transistor MP31 is connected with the positive power supply VDD and a source of the N-channel MOS transistor MN31 is connected with the negative power supply VSS. A drain of the P-channel MOS transistor MP31 and a drain of the N-channel MOS transistor MN31 are connected with an output terminal OUT in common. Also, the output terminal OUT is connected with the floating current source 201 through phase compensation capacitances C1 and C2. In detail, one end of the phase compensation capacitance C1 is connected with the floating current source 201 through the node N3 and the other end thereof is connected with the output terminal OUT. One end of the phase compensation capacitance C2 is connected with the floating current source 201 through the node N4 and the other end thereof is connected with the output terminal OUT.

An idling current in the class AB amplifier circuit in the first conventional example is determined by the floating current source 201. The power consumption amount of the idling current when the output terminal OUT is directly connected with the input terminal INM to use the class AB amplifier circuit as a voltage follower circuit will be described. The class AB amplifier circuit used as the voltage follower is an amplifier circuit having high input impedance and a low output impedance, and outputs a voltage supplied to the input terminal INP to the output terminal OUT just as it is.

Here, it is supposed that each of the drain currents of the P-channel MOS transistor MP15 and the N-channel MOS transistor MN15 as the constant current source is 2I in the input stage circuit 10. When the voltage of the input terminal INP and that of the output terminal OUT are same, a half I of the drain current flowing through each of the P-channel MOS transistor MP15 and the N-channel MOS transistor MN15 flows through the drains of the P-channel MOS transistor MP11, the P-channel MOS transistor MP12, the N-channel MOS transistor MN11, and the N-channel MOS transistor MN12.

When the voltage at the input terminal INP is shifted to the side of a higher voltage as compared with the voltage at the output terminal OUT, current of the same value as the drain current 2I which flows through the input stage constant current source (the P-channel MOS transistor MP15 or the N-channel MOS transistor MN15) flows through the P-channel MOS transistor MP11 and the N-channel MOS transistor MN12. However, any current does not flow through the P-channel MOS transistor MP12 and the N-channel MOS transistor MN11.

On the other hand, because the P-channel MOS transistor MP13 and the P-channel MOS transistor MP14 form a current mirror circuit, the current which flows through the P-channel MOS transistor MP14 becomes zero. Similarly, because the N-channel MOS transistor MN13 and the N-channel MOS transistor MN14 form a current mirror circuit, the current which flows through the N-channel MOS transistor MN14 becomes 2I.

The gate voltage of the P-channel MOS transistor MP31 in the last stage circuit 30 falls because of a difference "−2I" between the current value "2I" of the N-channel MOS transistor MN12 and the current value "0" of the P-channel MOS transistor MP14. Also, the gate voltage of the N-channel MOS transistor MN31 in the last stage circuit 30 falls because of a difference "−2I" between the current value "2I" of the N-channel MOS transistor MN14 and the current value "0" of the P-channel MOS transistor MP12. Thus, the voltage of the output terminal OUT follows the voltage of the input terminal INP and changes to the side of the higher voltage. At this time, the phase compensation capacitance C2 functions as a coupling capacitance, to increase the gate voltage of the N-channel MOS transistor MN31 with the change of the voltage at the output terminal OUT. When the gate voltage of the N-channel MOS transistor MN31 rises, a penetrating current flows through a route from the positive power supply VDD to the negative power supply VSS through the P-channel MOS transistor MP31 and the N-channel MOS transistor MN31.

When the voltage of the input terminal INP is changed to the side of the lower voltage as compared with the voltage of the output terminal OUT, a current does not flow through the P-channel MOS transistor MP11 and the N-channel MOS transistor MN12. However, a current of the same value as the drain current 2I flows through the P-channel MOS transistor MP12 and the N-channel MOS transistor MN11. On the other hand, because the P-channel MOS transistor MP13 and the P-channel MOS transistor MP14 form the current mirror circuit, the current which flows through the P-channel MOS transistor MP14 becomes 2I. Similarly, because the N-channel MOS transistor MN13 and the N-channel MOS transistor MN14 form the current mirror circuit, the current which flows through the N-channel MOS transistor MN14 becomes zero.

The gate voltage of the P-channel MOS transistor MP31 rises because of a difference "+2I" between the current value "0" of the N-channel MOS transistor MN12 and the current value "2I" of the P-channel MOS transistor MP14. Also, the gate voltage of the N-channel MOS transistor MN31 rises because of a difference "+2I" between the current value "0" of the N-channel MOS transistor MN14 and the current value "2I" of the P-channel MOS transistor MP12. Therefore, the voltage at the output terminal OUT follows the voltage of the input terminal INP and changes to the side of the lower voltage. At this time, the phase compensation capacitance C1 functions as a coupling capacitance, to decrease the gate voltage of the P-channel MOS transistor MP31 with the change of the voltage of the output terminal OUT. When the gate voltage of the P-channel MOS transistor MP31 falls, the penetrating current flows through the course from the positive power supply VDD to the negative power supply VSS through the P-channel MOS transistor MP31 and the N-channel MOS transistor MN31.

As described above, in the class AB amplifier circuit of the first conventional example, the voltage of the output terminal OUT follows the voltage of the input terminal INP.

Also, the class AB amplifier circuit using a folded cascade type differential amplifying circuit is described in Japanese Patent Application Publications (JP-P2006-094533A: second conventional example; JP-A-Heisei 06-326529: third conventional example).

In order to realize a Rail-to-Rail system, the class AB differential amplifying circuit in the second and third conventional examples includes an input stage circuit having two differential pairs to which a differential signal is supplied, a middle stage circuit having two cascode circuits respectively connected with outputs of the two differential pairs, and a last stage circuit connected with the middle stage circuit to output an output signal according to the differential signal.

The middle stage circuit includes a floating current source to which a bias voltage is supplied. The last stage circuit is a class AB output stage circuit in which an idling current is controlled with the floating current source. Also, in the class AB amplifier circuit in the second conventional example, a phase compensation capacitance is provided between the middle stage circuit and the last stage circuit. One end of the phase compensation capacitance is connected with a connection node of the differential pair and the cascode circuit and the other end thereof is connected with the output terminal OUT.

A power consumption amount when the AB class differential amplifying circuit in the first conventional example is used as a voltage follower circuit to drive a liquid crystal panel will be described. When the voltage of the input terminal INP of the class AB differential amplifying circuit is changed to the side of a higher voltage as compared with the voltage of the output terminal OUT, the voltage of the output terminal OUT follows the voltage of the input terminal INP and changes to the side of the higher voltage, as described above. At this time, the phase compensation capacitance C2 functions as the coupling capacitance and the penetrating current flows through the route from the positive power supply VDD to the negative power supply VSS through the P-channel MOS transistor MP31 and the N-channel MOS transistor MN31. Similarly, when the voltage at the input terminal INP is changed to the side of a lower voltage as compared with the voltage of the output terminal OUT, the phase compensation capacitance C1 functions as the coupling capacitance and the penetrating current flows through the route from the positive power supply VDD to the negative power supply VSS through the P-channel MOS transistor MP31 and the N-channel MOS transistor MN31. Such a penetrating current does not contribute to charging and discharging operations to a capacitive load in the liquid crystal panel at all.

Next, a case to use the class AB amplifier circuit in the second or third conventional example as voltage follower circuit will be described. The middle stage circuit in the class AB amplifier circuit adds a current outputted from a differential pair of an input stage circuit. Also, it is necessary for a current which is larger than a current from a constant current source connected with the input stage circuit to flow through a floating current source in the middle stage circuit. For example, supposing that the current of the constant current source in the input stage circuit is 2I, in the class AB amplifier circuit of the first conventional example, it is possible to design the amplifier circuit under the condition that the current is "4I" which flows through the input stage circuit, and the current value is "I" which flows through the middle stage circuit. On the other hand, in the class AB amplifier circuit the second conventional example, it is necessary that the current is "4I" which flows through the input stage circuit, and the current is "6I" which flows through the middle stage circuit. That is, the current consumption amount of the class AB amplifier circuit in the second conventional example is twice the current consumption amount of the class AB amplifier circuit in the second conventional example.

Also, the class AB amplifier circuit of a folded cascade type in the second conventional example uses many elements and does not suit for chip shrinkage. As described above, a plurality of class AB amplifier circuits (400-700 circuits) connected to form voltage follower circuits as buffer circuits are included in the liquid crystal driver. Therefore, it is strongly required to decrease the power consumption amount and the chip area of the class AB amplifier circuit.

SUMMARY

In an aspect of the present invention, a class AB amplifier circuit includes an input stage circuit including a first differential pair configured to receive a differential signal and a first current mirror circuit connected with the first differential pair through a first node; a middle stage circuit including a floating constant current source connected with the first node, a first transistor whose gate is applied with a bias voltage, and a first constant current source connected with the first node through the first transistor; a last stage circuit including a first output stage transistor whose gate is connected with the first node and which controls a voltage of an output terminal; and a first phase compensation capacitance having one end connected with a first connection node between the first constant current source and the first transistor and the other end connected with the output terminal.

In another aspect of the present invention, a display apparatus includes the above class AB amplifier circuit of a voltage follower configuration; a digital-to-analog converter configured to supply a display signal to a non-inversion input terminal of the amplifier circuit based on one of reference voltages generated by a gray scale voltage generating circuit; and a display panel including a pixel capacitance activated in response to a voltage outputted from the class AB amplifier circuit request based on the display signal.

According to the present invention, the consumption power amount of the class AB amplifier circuit can be reduced. Also, the chip area of the class AB amplifier circuit can be reduced. Moreover, it is possible to drive capacitive load in a display panel at high speed.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF PREFERRED EMBODIMENTS

Figure 1:
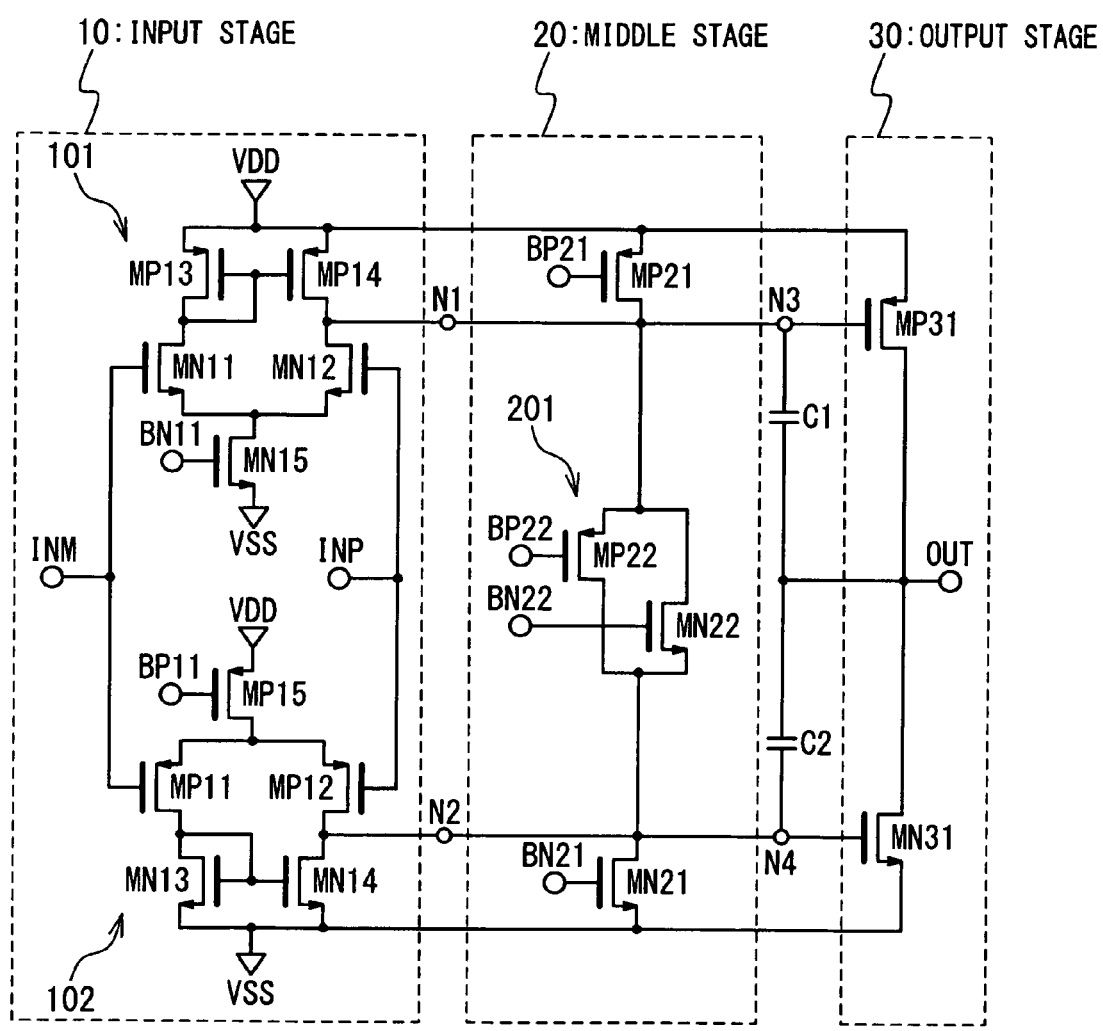
FIG. 1 is a circuit diagram showing a configuration of a conventional class AB amplifier circuit.

Hereinafter, a display apparatus using a class AB amplifier circuit of the present invention will be described with reference to the attached drawings. In the drawings, the same and similar reference numerals or symbols are assigned to the same and similar components.

Figure 2:
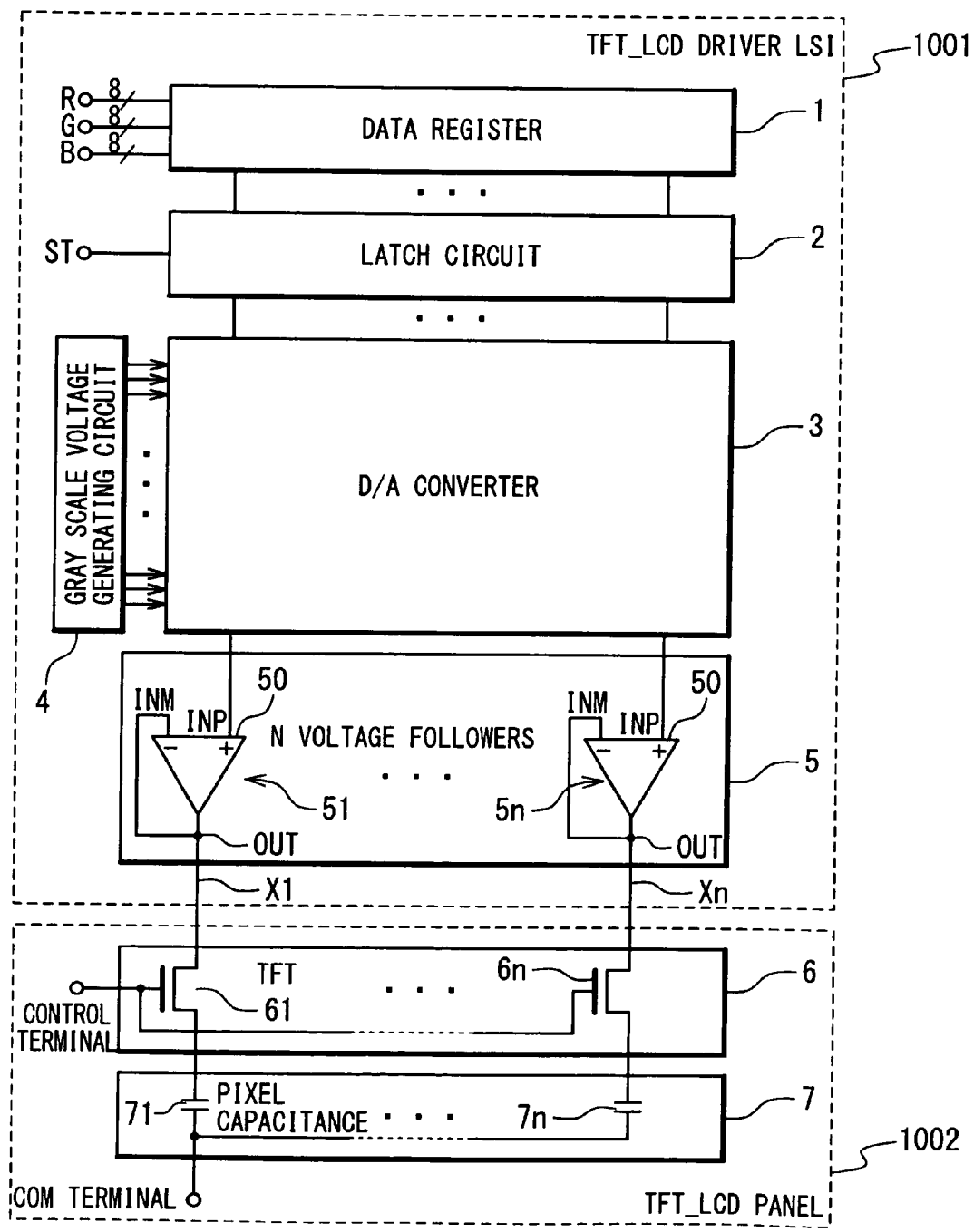
FIG. 2 is a block diagram showing a configuration of a display apparatus according to the present invention.

FIG. 2 is a block diagram showing a configuration of a display apparatus 1000 according to the present invention. Referring to FIG. 2, the display apparatus 1000 includes a TFT_LCD driver LSI (hereinafter, to be referred as a liquid crystal driver) 1001 and a liquid crystal panel 1002 which is driven by the liquid crystal driver 1001.

The liquid crystal driver 1001 includes a data register 1 that holds digital display signals R, G and B of 8 bits, a latch circuit 2 which latches the digital signals R, G and B in synchronous with a strobe signal ST, a D/A (digital-to-analog) converter 3 which includes N digital-to-analog stages in parallel, a liquid crystal gray scale voltage generating circuit 4 which outputs a gray scale voltage which has a gamma conversion characteristic according to the characteristic of liquid crystal, and a data line drive circuit section 5 which has N voltage follower circuits 51 to 5n for buffering a voltage from the digital-to-analog converter 3.

The liquid crystal panel 1002 includes TFTs (Thin Film Transistors) 61 to 6n (TFT group 6) and pixel capacitances 71 to 7n (pixel capacitance group 7) which are provided for the intersection portions of data lines X1 to Xn and scan lines Y1. The gates of the TFT 61 to 6n are connected with a gate driver (not shown) through the scan line Y1. Also, the sources of the TFT 61 to 6n are connected with voltage follower circuit 51 to 5n through the data lines X1 to Xn and the drains thereof are connected with a COM terminal through the pixel capacitances 71 to 7n. In the liquid crystal panel 1002 of FIG. 2, only the TFT group 6 and the pixel capacitance group 7 for one scan line Y1 for 1 line are shown. However, generally, M of the TFT groups 6 and M of the pixel capacitance groups 7 for M scan lines are provided.

The liquid crystal gray scale voltage generating circuit 4 generates reference voltages and one reference voltage is selected by a decoder (not shown) which is composed of ROM switches in the digital-to-analog converter 3 and so on. The digital-to-analog converter 3 D/A-converts the 8-bit digital display signal from the latch circuit 2 based on the selected reference voltage and supplies it to the N voltage follower circuits 51 to 5n. The voltage follower circuits 51 to 5n applies the converted voltage on the liquid crystal elements functioning as the pixel capacitances 71 to 7n through the TFTs 61 to 6n. At this time, the gates of TFT group 7 are driven by the gate driver (not shown).

Each of the voltage follower circuits 51 to 5n according to the present invention includes a class AB amplifier circuit 50 to which an output terminal OUT and an inversion input terminal INM are connected. Hereinafter, the configuration of the class AB amplifier circuit 50 which forms each of the voltage follower circuits 51 to 5n and the details of the operation will be described.

First Embodiment

Figure 3:
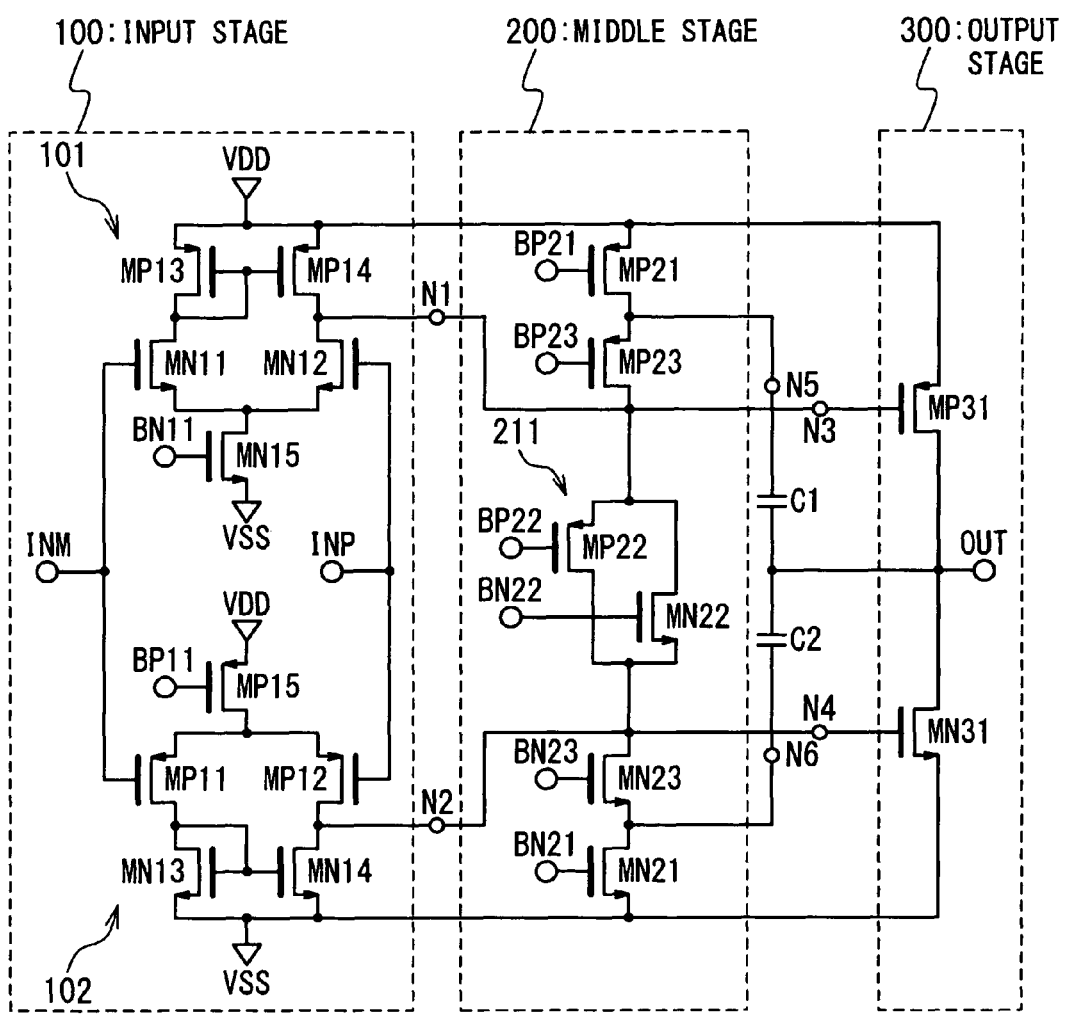
FIG. 3 is a circuit diagram showing a configuration of a class AB amplifier circuit according to a first embodiment of the present invention.

Referring to FIG. 3, the configuration of the class AB amplifier circuit 50 according to a first embodiment of the present invention will be described. The class AB amplifier circuit 50 of the first embodiment includes an input stage circuit 100 which receives a non-inversion input signal IMP and an inversion input signal IMN which are a complimentary signal, a middle stage circuit 200 connected with the input stage circuit 10 through nodes N1 and N2, and a last stage circuit 300 which is connected with the middle stage circuit 200 through nodes N3, N4, N5 and N6 and outputs an output signal OUT.

The input stage circuit 100 includes a differential circuit 101 which outputs an output to the node N1, in accordance with a non-inversion input signal and an inversion input signal supplied to a non-inversion input terminal INP and an inversion input terminal INN, and a differential circuit 102 which supplies an output to the node N2 in accordance with the non-inversion input signal and the inversion input signal inputted from the non-inversion input terminal INP and the inversion input terminal INN. In the input voltage range in which the differential circuit 101 does not operate, the differential circuit 102 operates, and in the input voltage range in which the differential circuit 102 does not operate, the differential circuit 101 operates. Thus, the differential stage which operates in the whole input voltage range can be obtained. That is, the class AB amplifier circuit 50 of a Rail-to-Rail type can be realized.

The details of the configuration of the differential circuit 101 will be described. The differential circuit 101 includes an N-channel MOS transistor MN11 whose gate is connected with the input terminal INM, an N-channel MOS transistor MN12 whose gate is connected with the input terminal INP, an N-channel MOS transistor MN15 and P-channel MOS transistors MP13 and MP14. Sources of the N-channel MOS transistor MN11 and the N-channel MOS transistor MN12 forming a first differential pair are connected in common. The N-channel MOS transistor MN15 is provided between the first differential pair and a negative power supply (power supply of the side of the lower voltage) VSS. In detail, the source of the N-channel MOS transistor MN15 is connected with the negative power supply VSS, a drain thereof is connected with sources of the N-channel MOS transistor MN11 and the N-channel MOS transistor MN12 in common, and a gate thereof is connected with a constant voltage source terminal BN11. A bias voltage (a constant voltage) is supplied to the constant voltage source terminal BN11 and the N-channel MOS transistor MN15 functions as the constant current source. Sources of the P-channel MOS transistor MP13 and the P-channel MOS transistor MP14 are connected with a positive power supply (a power supply of the side of the higher voltage) VDD in common. A drain and a gate of the P-channel MOS transistor MP13 and a gate of the P-channel MOS transistor MP14 are connected with the drain of the N-channel MOS transistor MN11 in common. A drain of the P-channel MOS transistor MP14 and a drain of the N-channel MOS transistor MN12 are connected with the node N1 in common.

The configuration of the differential circuit 102 will be described in detail. The differential circuit 102 includes a P-channel MOS transistor MP11 whose gate is connected with the input terminal INM, a P-channel MOS transistor MP12 whose gate is connected with the input terminal INP, a P-channel MOS transistor MP15, and N-channel MOS transistors MN13 and MP14. The P-channel MOS transistor MP11 and the P-channel MOS transistor MP12 having sources connected in common forms a second differential pair. The P-channel MOS transistor MP15 is provided between the second differential pair and the positive power supply VDD. A source of the P-channel MOS transistor MP15 is connected with the positive power supply VDD, a drain thereof is connected with sources of the P-channel MOS transistor MP11 and the P-channel MOS transistor MP12 in common. A gate thereof is connected with a constant voltage source terminal BP11. A bias voltage (a constant voltage) is supplied to the constant voltage source terminal BP11 and the P-channel MOS transistor MP15 functions as a constant current source. Sources of the N-channel MOS transistor MN13 and the N-channel MOS transistor MN14 are connected with the negative power supply VSS in common. A drain and a gate of the N-channel MOS transistor MN13, and a gate of the N-channel MOS transistor MN14 are connected with a drain of the P-channel MOS transistor MP11 in common. A drain of the N-channel MOS transistor MN14 and a drain of the P-channel MOS transistor MP12 are connected with the node N2 in common.

The gate of the P-channel MOS transistor MP11 and the gate of the N-channel MOS transistor MN11 are connected with the input terminal INM in common. The gate of the P-channel MOS transistor MP12 and the gate of the N-channel MOS transistor MN12 are connected with the input terminal INP in common.

The middle stage circuit 200 includes an N-channel MOS transistor MN22, a P-channel MOS transistor MP22 which function as a floating current source 211, a P-channel MOS transistor MP21 which is connected with the positive power supply VDD and functions as a constant current source, an N-channel MOS transistor MN21 which is connected with the negative power supply VSS and functions as a constant current source, a P-channel MOS transistor MP23 which is connected between the floating current source 211 and the P-channel MOS transistor MP21, and an N-channel MOS transistor MN23 which is connected between the floating current source 211 and the N-channel MOS transistor MN21.

A gate of the P-channel MOS transistor MP21 is connected with a constant voltage source terminal BP21 to which a bias voltage is supplied, a source of the P-channel MOS transistor MP21 is connected with the positive power supply VDD and a drain thereof is connected with a source of the P-channel MOS transistor MP23 and the node N5 in common. A gate of the N-channel MOS transistor MN21 is connected with a constant voltage source terminal BN21 to which a bias voltage is supplied. A source of the N-channel MOS transistor MN21 is connected with the negative power supply VSS and a drain thereof is connected with a source of the N-channel MOS transistor MN23 and the node N6 in common.

A gate of the P-channel MOS transistor MP22 is connected with a constant voltage source terminal BP22 to which a bias voltage is supplied. A source of the P-channel MOS transistor MP22 is connected with a drain of the N-channel MOS transistor MN22, a drain of the P-channel MOS transistor MP23, and the nodes N1 and N3 in common. A drain of the P-channel MOS transistor MP22 is connected with a source of the N-channel MOS transistor MN22, a drain of the N-channel MOS transistor MN23, and the nodes N2 and N4 in common. A gate of the N-channel MOS transistor MN22 is connected with a constant voltage source terminal BN22 to which a bias voltage is supplied. A source of the N-channel MOS transistor MN22 is connected with the drain of the P-channel MOS transistor MP22, the drain of the N-channel MOS transistor MN23, and the nodes N2 and N4 in common. The drain of the N-channel MOS transistor MN22 is connected with the source of the P-channel MOS transistor MP22, the drain of the P-channel MOS transistor MP23, and the nodes N1 and N3 in common.

The gate of the P-channel MOS transistor MP23 is connected with a constant voltage source terminal BP23 to which a bias voltage is supplied. The source of the P-channel MOS transistor MP23 is connected with the drain of the P-channel MOS transistor MP21 and the node N5 in common and the drain thereof is connected with the floating current source 211 and the node N1 and N3 in common. By such a configuration, the P-channel MOS transistor MP23 operates to fix the voltage of the node N5. The gate of the N-channel MOS transistor MN23 is connected with a constant voltage source terminal BN23 to which a bias voltage is supplied. The source of the N-channel MOS transistor MN23 is connected with the drain of the N-channel MOS transistor MN21 and the node N6 in common, a drain thereof is connected with the floating current source 211 and the node N2 and N4 in common. By such a configuration, the N-channel MOS transistor MN23 operates to fix the voltage of the node 6.

The last stage circuit 300 is an AB class output stage, whose output OUT is controlled in accordance with the floating current source 211 of the middle stage circuit 200. The last stage circuit 300 includes a P-channel MOS transistor MP31 whose gate is connected with the floating current source 211 through the node N3, an N-channel MOS transistor MN31 whose gate is connected with the floating current source 211 through the node N4. A source of the P-channel MOS transistor MP31 is connected with the positive power supply VDD and A source of the N-channel MOS transistor MN31 is connected with the negative power supply VSS. A drain of the P-channel MOS transistor MP31 and a drain of the N-channel MOS transistor MN31 are connected with the output terminal OUT in common. Here, the P-channel MOS transistor MP31 and the N-channel MOS transistor MN31 are referred to as an output stage transistors.

Also, the output terminal OUT is connected with the nodes N5 and N6 through phase compensation capacitances C1 and C2. In detail, one end of the phase compensation capacitance C1 is connected with the floating current source 211 through the node N5 and the P-channel MOS transistor MP23 and the other end thereof is connected with output OUT. Also, one end of the phase compensation capacitance C2 is connected with the floating current source 211 through the node N6 and the N-channel MOS transistor MN23 and the other end thereof is connected with output OUT.

When the class AB amplifier circuit 50 having the above configuration is used as the voltage follower circuit 5n shown in FIG. 2, the input terminal INM is connected directly with the output terminal OUT.

Hereinafter, the operation of the class AB amplifier circuit 50 in the first embodiment which is used as the voltage follower circuit 5n will be described. In this case, it is supposed that the drain current of each of the P-channel MOS transistor MP15 and the N-channel MOS transistor MN15 as the constant current sources in the input stage circuit is 2I.

When the voltage of the input terminal INP and that of the output terminal OUT are the same, a current I which is a half of the drain current which flows through the P-channel MOS transistor MP15 or the N-channel MOS transistor MN15 flows through each of the P-channel MOS transistor MP11, the P-channel MOS transistor MP12, the N-channel MOS transistor MN11, and the N-channel MOS transistor MN12. When the voltage of the input terminal INP is changed to the side of the higher voltage as compared with the output terminal OUT, the current of the same value 2I as the current which flows through the input stage constant current sources (the P-channel MOS transistor MP15 and the N-channel MOS transistor MN15) flows through the P-channel MOS transistor MP11 and the N-channel MOS transistor MN12. No current flows through the P-channel MOS transistor MP12 and the N-channel MOS transistor MN11. On the other hand, because the P-channel MOS transistor MP13 and the P-channel MOS transistor MP14 form a current mirror circuit, the current which flows through the P-channel MOS transistor MP14 becomes zero. Similarly, because the N-channel MOS transistor MN13 and the N-channel MOS transistor MN14 form a current mirror circuit, the current which flows through the N-channel MOS transistor MN14 becomes 2I.

The gate voltage of the P-channel MOS transistor MP31 in the last stage circuit 30 falls because of a difference "−2I" between the current value "0" of the P-channel MOS transistor MP14 and the current value "2I" of the N-channel MOS transistor MN12. Also, the gate voltage of the N-channel MOS transistor MN31 in the last stage circuit 300 falls because of a difference "−2I" between the current value "0" of the P-channel MOS transistor MP12 and the current value "2I" of The N-channel MOS transistor MN14. With this, the P-channel MOS transistor MP31 is set to an on-state and the N-channel MOS transistor MN31 is set to the off-state. The voltage of the output terminal OUT rises with the positive power supply VDD. Therefore, the voltage of the output terminal OUT follows the voltage of the input terminal INP and changes to the side of the higher voltage.

At this time, the phase compensation capacitance C2 operates as a coupling capacitance to try to increase the source voltage (the voltage of the node N6) of the N-channel MOS transistor MN23 with the change of the output terminal OUT. However, because the drain current of the N-channel MOS transistor MN23 is kept constant with the bias voltage from the constant voltage source terminal BN23, the gate-source voltage in the N-channel MOS transistor MN23 does not change. That is, the source voltage (the voltage at the node N6) of the N-channel MOS transistor MN23 does not rise. Therefore, the voltage change of the output terminal OUT does not influence the gate voltage (the voltage at the nodes N1 and N3) of the N-channel MOS transistor MN31, and the voltage change of the output terminal OUT does not change an idling current which flows through the drain of the N-channel MOS transistor MN31.

When the voltage of the input terminal INP is changed to the side of the lower voltage as compared with the output terminal OUT, the current does not flow through the P-channel MOS transistor MP11 and the N-channel MOS transistor MN12. The current having the same value as the drain current 2I which flows through the input stage constant current source (P-channel MOS transistor MP15 or the N-channel MOS transistor MN15) flows through the P-channel MOS transistor MP12 or the N-channel MOS transistor MN11. On the other hand, because the P-channel MOS transistor MP13 and the P-channel MOS transistor MP14 form the current mirror circuit, the current which flows through the P-channel MOS transistor MP14 becomes 2I. Similarly, the N-channel MOS transistor MN13 and the N-channel MOS transistor MN14 form a current mirror circuit. Therefore, the current value which flows through the N-channel MOS transistor MN14 becomes zero.

The gate voltage of the P-channel MOS transistor MP31 rises because of a difference "+2I" between the current value "2I" of the P-channel MOS transistor MP14 and the current value "0" of the N-channel MOS transistor MN12. Also, the gate voltage of the N-channel MOS transistor MN31 rises because of a difference "+2I" between the current value "2I" of the P-channel MOS transistor MP12 and the current value "0" of the N-channel MOS transistor MN14. With this, the P-channel MOS transistor MP31 is set to an off-state and he N-channel MOS transistor MN31 is set to the on-state. The voltage of the output terminal OUT falls due to the negative power supply VSS. Therefore, the voltage of the output terminal OUT follows the voltage of the input terminal INP and changes to the side of the lower voltage.

At this time, the phase compensation capacitance C1 operates as the coupling capacitance to try to fall the source voltage (the voltage at the node N5) of the P-channel MOS transistor MP23 with the voltage change of the output terminal OUT. However, because the drain current of the P-channel MOS transistor MP23 is maintained constant with the bias voltage from the constant voltage source terminal BP23, the gate-source voltage of the P-channel MOS transistor MP23 does not change. That is, the source voltage (the voltage at the node N5) of the P-channel MOS transistor MP23 does not fall. Therefore, the voltage change of the output terminal OUT does not influence the gate voltage (the voltage at the nodes N2 and N4) of the P-channel MOS transistor MP31. The voltage change of the output terminal OUT does not change an idling current which flows through the drain of the P-channel MOS transistor MP31.

The voltage of the output terminal OUT follows the voltage of the input terminal INP in the class AB amplifier circuit 50 of the present invention. At this time, the phase compensation capacitance C1 or C2 operates as the coupling capacitance, as in the conventional technique. The voltages at the nodes N5 and N6 are fixed by the P-channel MOS transistor MP23 or the N-channel MOS transistor MN23. Therefore, the penetrating current which flowed in the class AB amplifier circuit in the conventional technique does not flow through the P-channel MOS transistor MP31 or the N-channel MOS transistor MN31. Only the idling current flows based on the preset bias voltage. Therefore, the class AB amplifier circuit 50 in the present invention can reduce the power consumption amount, compared with the conventional technique. Also, the class AB amplifier circuit 50 reduces the power consumption amount without extending the circuit area of the class AB amplifier circuit. Therefore, the circuit (chip) area can be reduced with the voltage follower circuits 5n using the class AB amplifier circuit 50 while suppressing the power consumption amount of liquid crystal driver 1001 or the display apparatus 1000.

Second Embodiment

Figure 4:
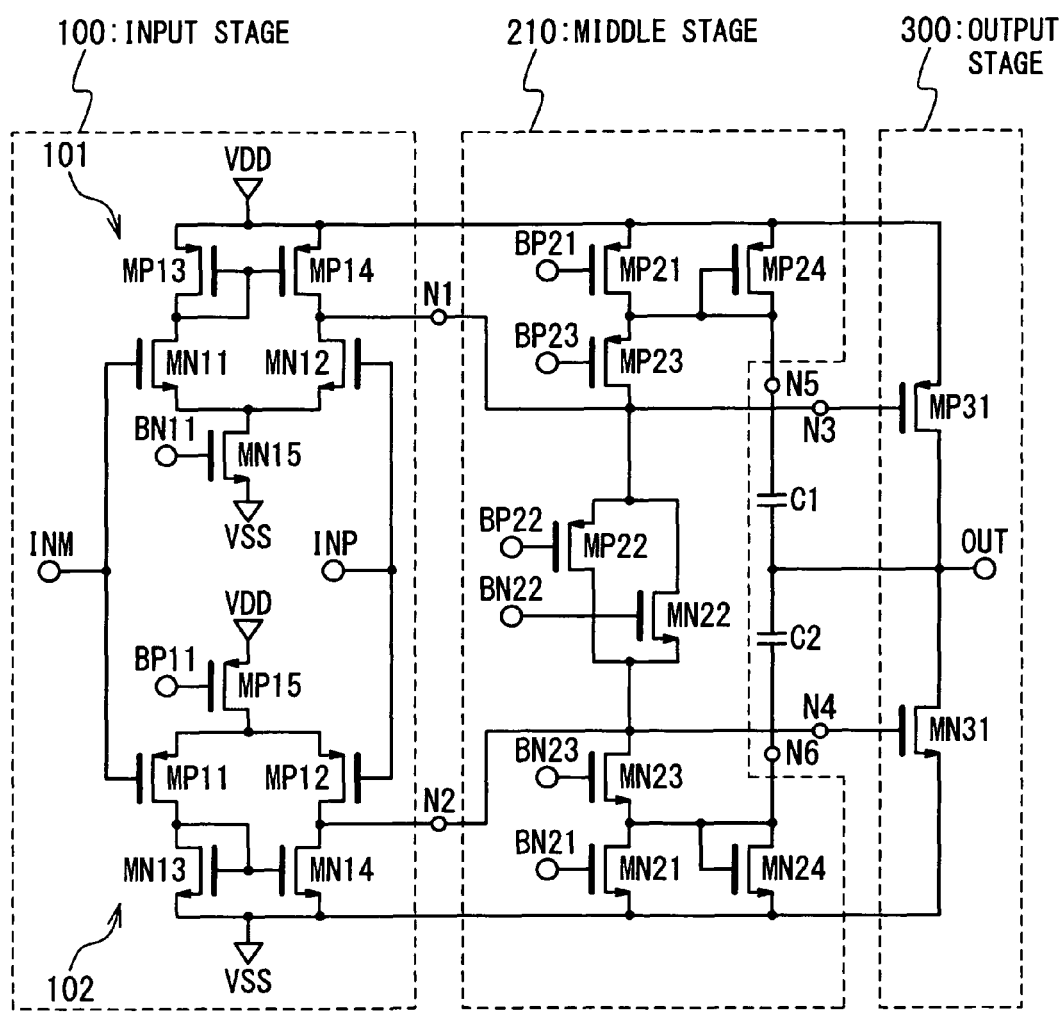
FIG. 4 is a circuit diagram showing a configuration of the class AB amplifier circuit according to a second embodiment of the present invention.

Referring to FIG. 4, a configuration of the class AB amplifier circuit 50 according to a second embodiment of the present invention will be described. The class AB amplifier circuit 50 in the second embodiment includes the input stage circuit 100 which receives the non-inversion input signal IMP and inversion input signal IMN which are a complementary signal, a middle stage circuit 210 which is connected with the input stage circuit 10 through the nodes N1 and N2, and the last stage circuit 300 which is connected with the middle stage circuit 210 through the nodes N3, N4, N5, and N6 and outputs an output signal OUT.

The configuration of the input stage circuit 100 and last stage circuit 300 in the second embodiment is same as in the first embodiment, and the description of them is omitted.

The middle stage circuit 210 in the second embodiment has the configuration in which a P-channel MOS transistor MP24 and an N-channel MOS transistor MN24 are added to the middle stage circuit 200 in the first embodiment. A source of the P-channel MOS transistor MP24 is connected with the positive power supply VDD and a gate and drain thereof are connected with the node N5 in common. A source of the N-channel MOS transistor MN24 is connected with the negative power supply VSS and a gate and drain thereof are connected with the node N6 in common. That is, the transistors are provided which are diode-connected between the positive power supply VDD and the phase compensation capacitance C1 and the negative power supply VSS and the phase compensation capacitance C2.

Referring to FIG. 4, an operation of the class AB amplifier circuit 50 in the second embodiment will be described. Here, when the voltage of the input terminal INP and that of the output terminal OUT is the same, it is assumed that the gate-source voltage in each of the P-channel MOS transistor MP24 and the N-channel MOS transistor MN24 becomes lower than a threshold voltage of the transistor, so that the transistor is set to the off state.

When the voltage of the input terminal INP is shifted to a higher voltage as compared with the voltage of the output terminal OUT, the current flows through a route from the node N5 to the N-channel MOS transistor MN15 via the P-channel MOS transistor MP23 the node N1 and the N-channel MOS transistor MN12, such that the phase compensation capacitance C1 discharges. Also, the phase compensation capacitance C2 discharges through a route from the node 6 to the N-channel MOS transistor MN21. That is, the phase compensation capacitance C1 discharges by the constant current source (the N-channel MOS transistor MN15) of the input stage circuit 10. The phase compensation capacitance C2 discharges by the constant current source (the N-channel MOS transistor MN21) of the middle stage circuit 210.

AT this time, the P-channel MOS transistor MP24 or the N-channel MOS transistor MN24 is on/off controlled according to the current from the constant current source (the P-channel MOS transistor MP21, the N-channel MOS transistor MN21) of the middle stage circuit 210. The phase compensation capacitances C1 and C2 discharge by the P-channel MOS transistor MP24 or the N-channel MOS transistor MN24 which is set to the on state. For example, in case where the voltage of the input terminal INP is shifted to a higher voltage as compared with the voltage of the output terminal OUT, and the current of the N-channel MOS transistor MN21 is lack, the N-channel MOS transistor MN24 is set to the on state so that the phase compensation capacitance C2 discharges the charges, because the voltage of the drain (node N6) of the N-channel MOS transistor MN21 rises.

On the other hand, when the voltage of the input terminal INP is shifted to a lower voltage as compared with the voltage of the output terminal OUT, the phase compensation capacitance C1 is charged with a current which flows from the P-channel MOS transistor MP21 through the node N5. Also, the phase compensation capacitance C2 is charged with a current which flows through a route from The P-channel MOS transistor MP15 to the node 6 via the node N2 and the N-channel MOS transistor MN23. That is, the phase compensation capacitance C1 is charged with a constant current source (the P-channel MOS transistor MP21) of the middle stage circuit 210.

The phase compensation capacitance C2 is charged with the constant current source (the P-channel MOS transistor MP15) of the input stage circuit 100. At this times, the P-channel MOS transistor MP24 or the N-channel MOS transistor MN24 are on/off controlled according to the current from the constant current source (the P-channel MOS transistor MP21, the N-channel MOS transistor MN21) of the middle stage circuit 210. The phase compensation capacitances C1 and C2 are charged with the P-channel MOS transistor MP24 and the N-channel MOS transistor MN24 which are set to the on state. For example, in case where the voltage of the input terminal INP is shifted to a lower voltage as compared with the voltage of the output terminal OUT, and the current of the P-channel MOS transistor MP21 is lack, the P-channel MOS transistor MP24 is set to the on state to charges the phase compensation capacitance C1, because the voltage of the drain (the node N5) of the P-channel MOS transistor MP21 falls.

The constant current source in the middle stage circuit needs to set a current value sufficient to charge and discharge to or from the phase compensation capacitance. However, in the class AB amplifier circuit 50 in the second embodiment, the charge/discharge of the phase compensation capacitance can be controlled by the P-channel MOS transistor MP24 or the N-channel MOS transistor MN24 that is diode-connected between the power supply and the phase compensation capacitance. Therefore, the current value of the constant current source (the P-channel MOS transistor MP21, the N-channel MOS transistor MN21) of the middle stage circuit 210 can be made small. Therefore, according to the present invention, the power consumption amount in the middle stage circuit is not larger than that of the input stage circuit, unlike the class AB amplifier circuit in the second conventional example. Also, even if the input voltage/output voltage changes like the first embodiment, the penetrating current does not flow through the output stage transistor (the P-channel MOS transistor MP31, the N-channel MOS transistor MN31). Moreover, because the phase compensation capacitance C1 and C2 are charged and discharged by the P-channel MOS transistor MP24 and the N-channel MOS transistor MN24 which are diode-connected, the speeding-up of the load drive can be realized.

The configuration that the penetrating current does not flow through the output stage transistor (the P-channel MOS transistor MP31, the N-channel MOS transistor MN31) can be applied to an amplifier circuit which does not need a Rail-to-Rail type input stage. Hereinafter, the class AB amplifier circuit that the input stage circuit includes a differential circuit 101 or 102 will be described with the reference of FIGS. 5 to 10.

Third Embodiment

Figure 5:
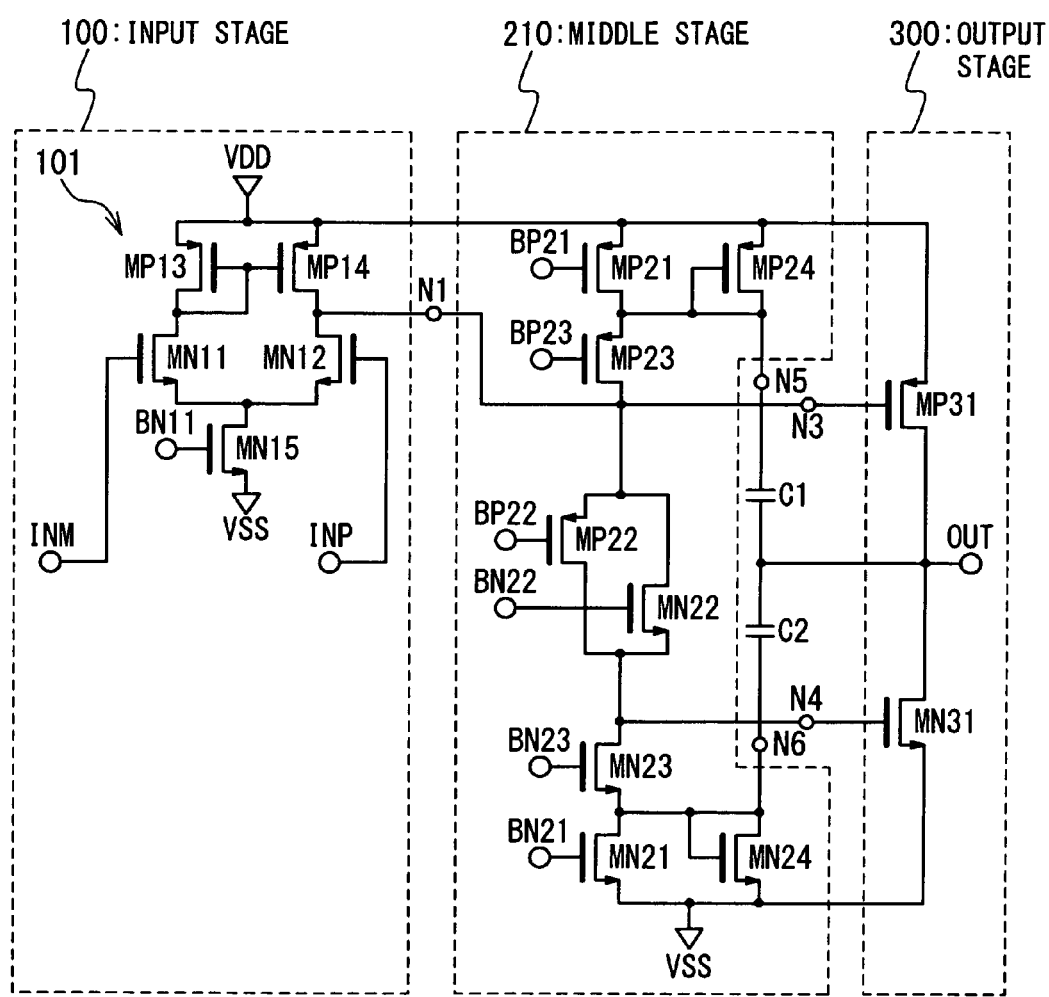
FIG. 5 is circuit diagram showing a configuration of the class AB amplifier circuit according to a third embodiment of the present invention.

Referring to FIG. 5, the class AB amplifier circuit 50 in the third embodiment has the configuration in which the differential circuit 102 is removed from the class AB amplifier circuit 50 in the second embodiment. That is, the class AB amplifier circuit 50 in the third embodiment includes the input stage circuit 100 from which the differential circuit 102 is removed, the middle stage circuit 210 having the same configuration as in the second embodiment, and the last stage circuit 300 in the second embodiment. Through such a configuration, the class AB amplifier circuit 50 in the third embodiment can operate in an input range from VSS+several V (e.g. 1 V) to VDD.

Hereinafter, the operation of the class AB amplifier circuit 50 in the third embodiment used as the voltage follower circuit will be described. The drain current of the N-channel MOS transistor MN15 which forms the constant current source of the input stage circuit is 2I.

When the voltage of the input terminal INP and that of the output terminal OUT is same, a current I which is a half of the drain current which flows through the N-channel MOS transistor MN15 flows through each of the N-channel MOS transistor MN11 and the N-channel MOS transistor MN12.

When the voltage of the input terminal INP is changed to a higher voltage as compared with the output terminal OUT, the gate voltage of the P-channel MOS transistor MP31 falls so that the P-channel MOS transistor MP31 is set to an on state, like the first embodiment. Thus, the voltage of the output terminal OUT follows the voltage of the input terminal INP to changes to a higher voltage.

At this time, the phase compensation capacitance C2 operates as a coupling capacitance, but like the first embodiment, the source voltage (the voltage of the node N6) of the N-channel MOS transistor MN23 does not rise. Therefore, the idling current which flows through the drain of the N-channel MOS transistor MN31 does not change even if the voltage of the output terminal OUT changes.

When the voltage of the input terminal INP is changed to a lower voltage as compared with the output terminal OUT, the gate voltage of the P-channel MOS transistor MP31 rises so that the P-channel MOS transistor MP31 is set to an off state, like the first embodiment. Therefore, the voltage of the output terminal OUT follows the voltage of the input terminal INP to change to the lower voltage.

At this time, the phase compensation capacitance C1 operates as a coupling capacitance, but like the first embodiment, the source voltage (the voltage of the node N5) of the P-channel MOS transistor MP23 does not fall. Therefore, the idling current which flows through the P-channel MOS transistor MP31 does not change even if the voltage of the output terminal OUT changes.

As above mentioned, according to the present invention, even in the class AB amplifier circuit to which the Rail-to-Rail system is not applied, the occurrence of the penetrating current in the last stage circuit 300 can be prevented. Also, the lack of the current of the constant current source in the middle stage circuit 210 can be compensated by the P-channel MOS transistor MP24, like the second embodiment. Therefore, the current which is necessary to charge and discharge the phase compensation capacitance can be reduced in the constant current source (the P-channel MOS transistor MP21) of the middle stage circuit 210.

Fourth Embodiment

Figure 6:
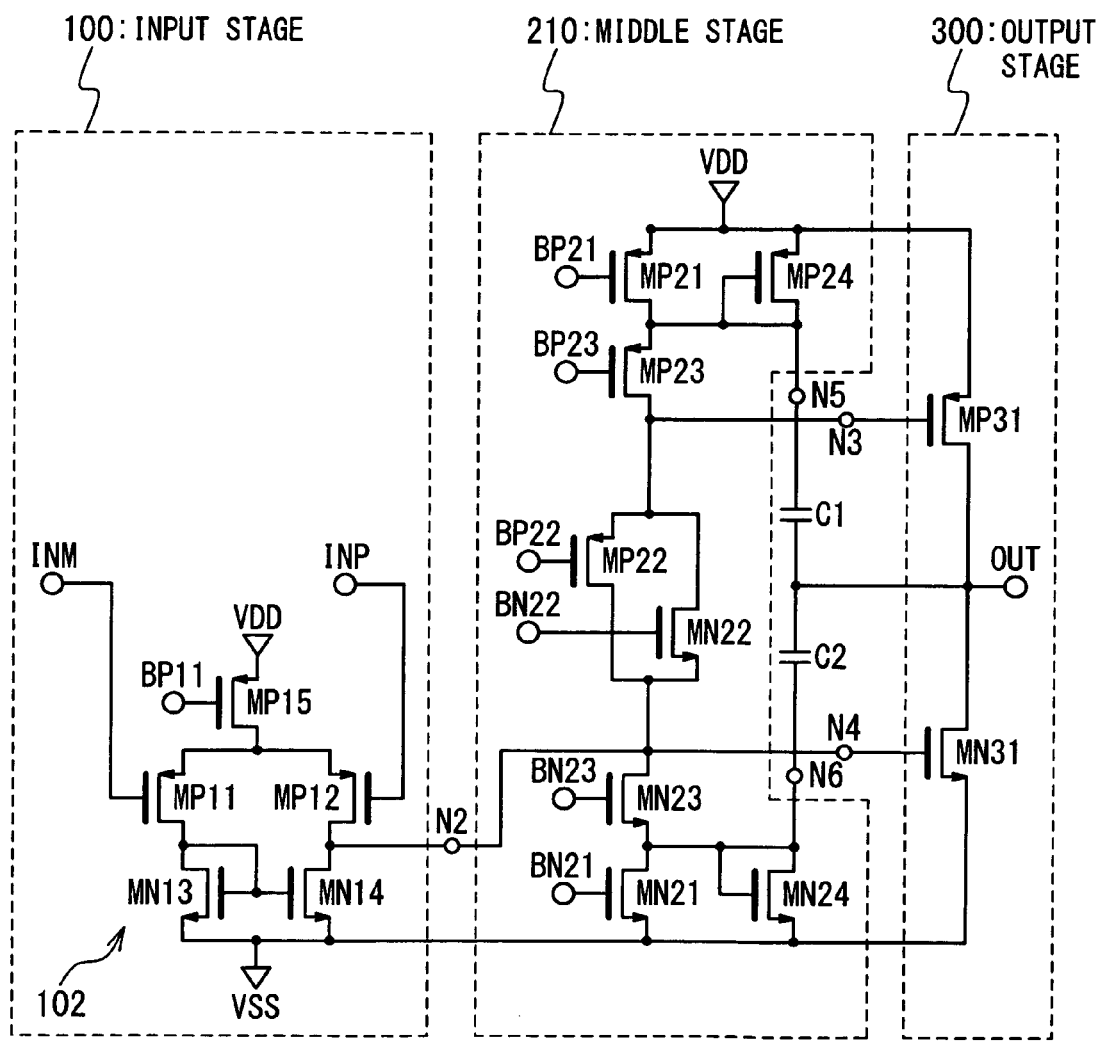
FIG. 6 is circuit diagram showing a configuration of the class AB amplifier circuit according to a fourth embodiment of the present invention.
Figure 7:
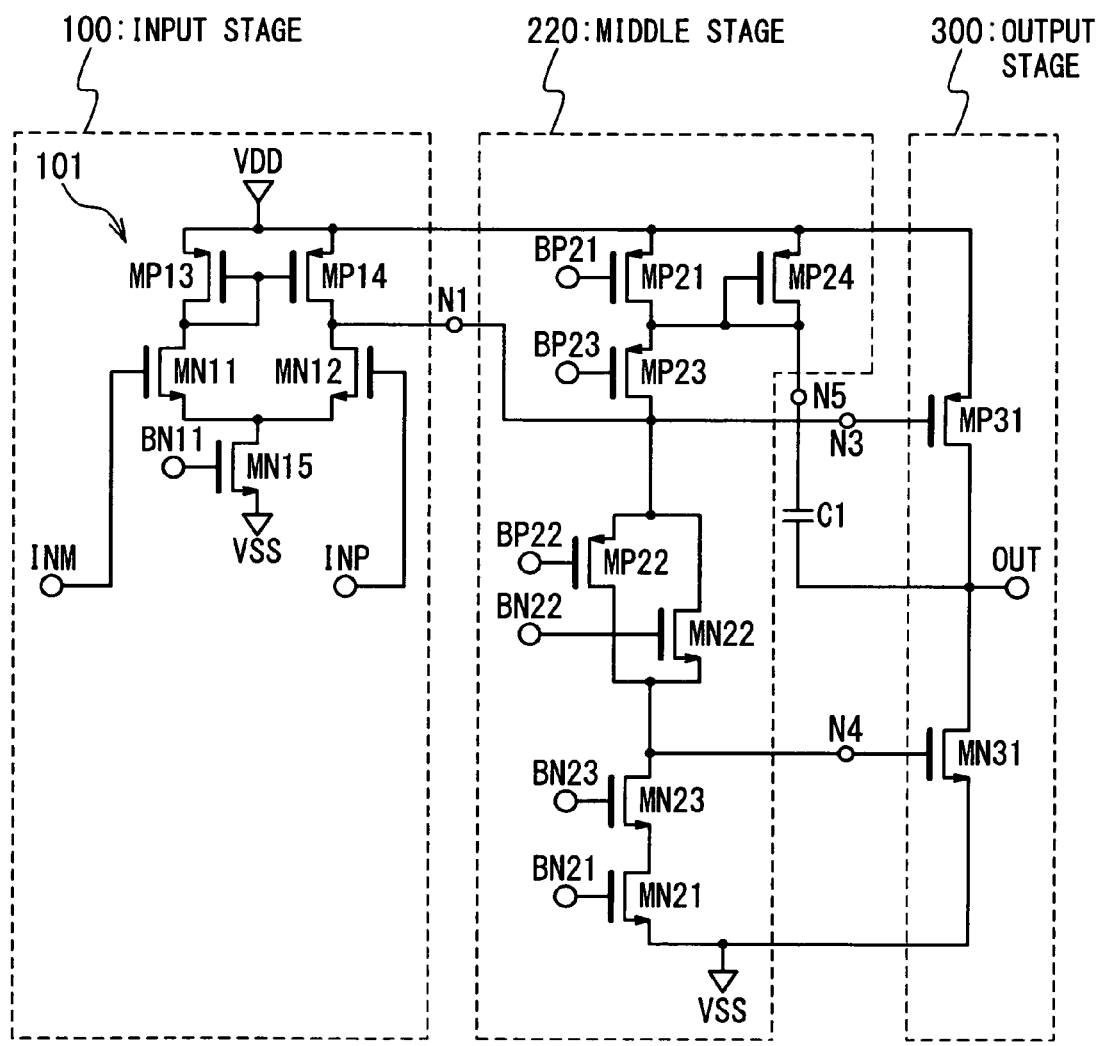
FIG. 7 is circuit diagram showing a configuration of the class AB amplifier circuit according to a modification of the third embodiment of the present invention.

Referring to FIG. 6, the class AB amplifier circuit 50 in the fourth embodiment has the configuration in which the differential circuit 101 is removed from the class AB amplifier circuit 50 in the second embodiment. That is, the class AB amplifier circuit 50 in the fourth embodiment includes the input stage circuit 100 in the first embodiment from which the differential circuit 101 is removed, and the middle stage circuit 210 and the last stage circuit 300 in the second embodiment. By such configuration, the class AB amplifier circuit 50 in the fourth embodiment operates in response to the input signal whose voltage range is from VSS to VDD—several V (e.g. 1 V).

Hereinafter, the operation of the class AB amplifier circuit 50 in the fourth embodiment used as the voltage follower circuit will be described. Here, the drain current of the N-channel MOS transistor MN15 which forms the constant current source in the input stage circuit is 2I.

When the voltage of the input terminal INP and that of the output terminal OUT is same, the current I which is a half of the drain current which flows through the P-channel MOS transistor MP15 flows through each of the P-channel MOS transistor MP11 and the P-channel MOS transistor MP12.

When the voltage of the input terminal INP is changed to a higher voltage as compared with the output terminal OUT, the gate voltage of the N-channel MOS transistor MN31 falls so that the N-channel MOS transistor MN31 is set to an off state, like the first embodiment. Thus, the voltage of the output terminal OUT follows the voltage of the input terminal INP to change to the higher voltage. At this time, the phase compensation capacitance C2 operates as a coupling capacitance, but like the first embodiment, the source voltage (the voltage of the node N6) of the N-channel MOS transistor MN23 does not rise. Therefore, the idling current which flows through the N-channel MOS transistor MN31 does not change even if the voltage of the output terminal OUT changes.

When the voltage of the input terminal INP is changed to a lower voltage as compared with the output terminal OUT, the gate voltage of the N-channel MOS transistor MN31 rises so that the N-channel MOS transistor MN31 is set to an on state, like the first embodiment. Therefore, the voltage of the output terminal OUT follows the voltage of the input terminal INP to change to the lower voltage. At this time, the phase compensation capacitance C1 operates as a coupling capacitance, but like the first embodiment, the source voltage (the voltage of the node N5) of the P-channel MOS transistor MP23 does not fall. Therefore, the idling current which flows through the P-channel MOS transistor MP31 does not change even if the voltage of the output terminal OUT changes.

As described above, according to the present invention, in the class AB amplifier circuit to which the Rail-to-Rail system is not applied, the occurrence of the penetrating current in the last stage circuit 300 can be prevented. Also, like the second embodiment, a lack of the current of the constant current source in the middle stage circuit 210 can be compensated by the P-channel MOS transistor MP24. Therefore, the current which is necessary to charge and discharge the phase compensation capacitance can be reduced in the constant current source (the P-channel MOS transistor MP21) of the middle stage circuit 210.

An example in which the phase compensation capacitance C1 or C2 is removed as a modification of the third or fourth embodiment will be described. The class AB amplifier circuit shown in FIG. 7 includes a middle stage circuit 220 in which the phase compensation capacitance C2 and the N-channel MOS transistor MN24 are removed from the middle stage circuit 210 in the third embodiment. The middle stage circuit 220 and the last stage circuit 300 are connected through the nodes N3, N4 and N5, and the drain of the N-channel MOS transistor MN23 is connected with the gate of the N-channel MOS transistor MN31 through the node N4.

Figure 8:
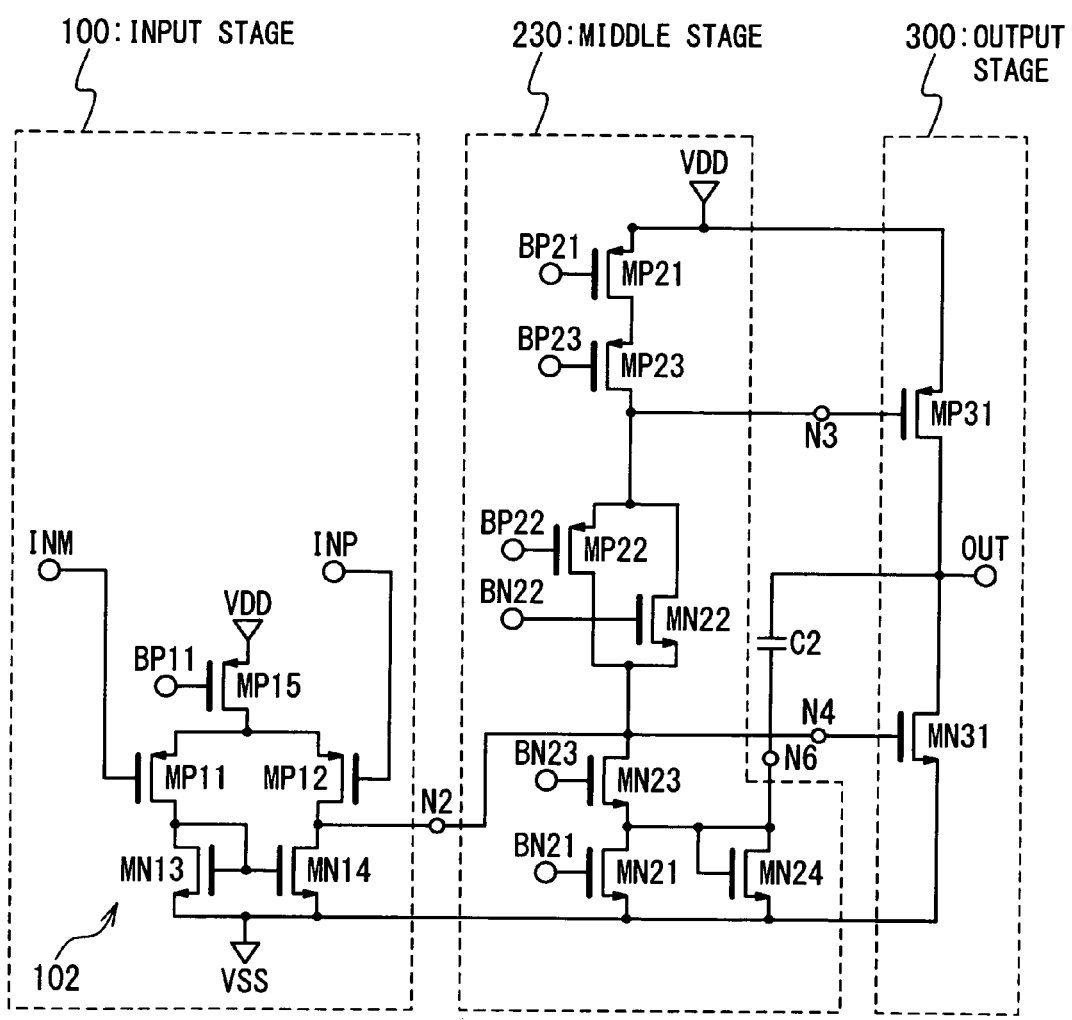
FIG. 8 is a circuit diagram showing a configuration of the class AB amplifier circuit according to another modification of the third embodiment of the present invention.

The class AB amplifier circuit shown in FIG. 8 includes a middle stage circuit 230 in which the phase compensation capacitance C1 and the P-channel MOS transistor MP24 are removed from the middle stage circuit 210 in the fourth embodiment. The middle stage circuit 230 and the last stage circuit 300 are connected through the nodes N3, N4 and N6, and the drain of the P-channel MOS transistor MP23 is connected with the gate of the P-channel MOS transistor MP31 through the node N3.

Figure 9:
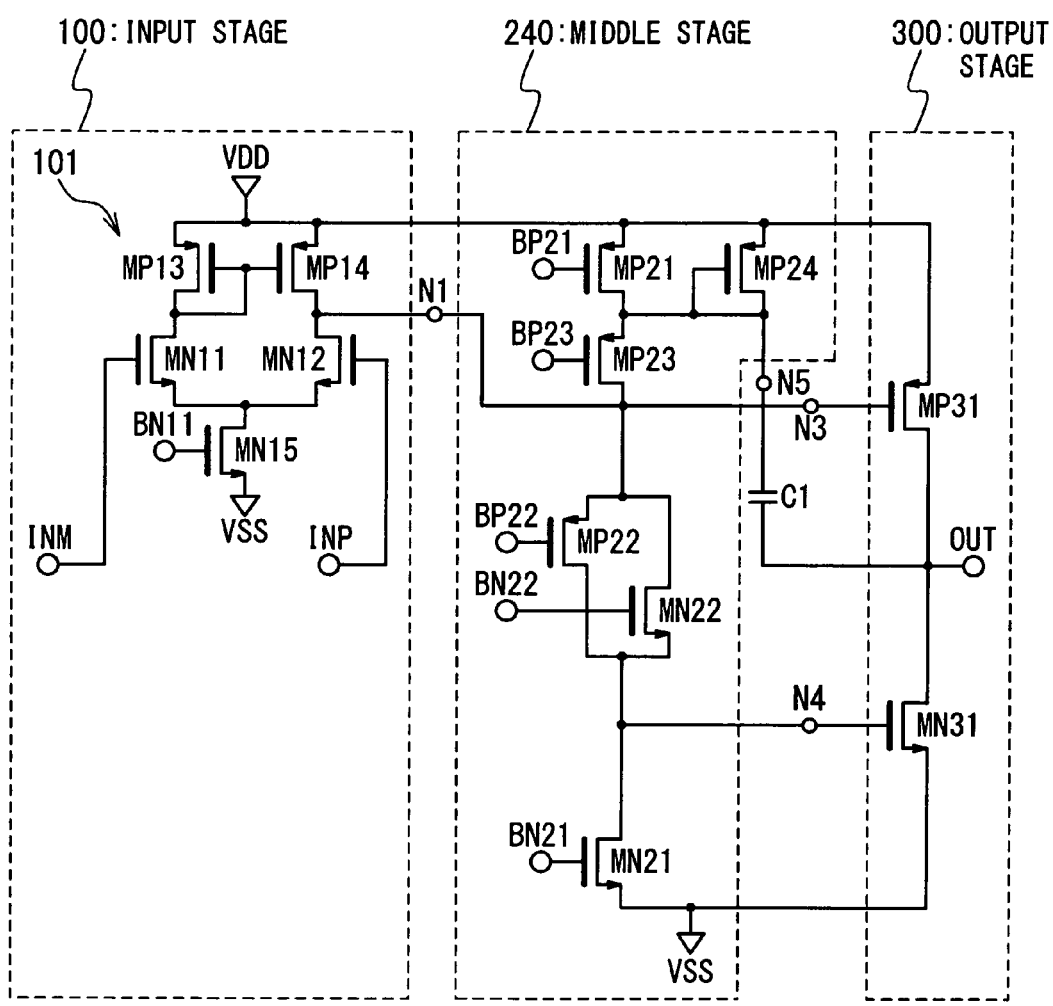
FIG. 9 is a circuit diagram showing a configuration of the class AB amplifier circuit according to another modification of the third embodiment of the present invention.

The class AB amplifier circuit shown in FIG. 9 includes a middle stage circuit 240 in which the phase compensation capacitance C2, the N-channel MOS transistor MN23, and the N-channel MOS transistor MN24 are removed from the middle stage circuit 210 in the third embodiment. The middle stage circuit 240 and the last stage circuit 300 are connected through the nodes N3, N4 and N5, and the source of the N-channel MOS transistor MN22 and the drain of the N-channel MOS transistor MN21 are connected with the P-channel MOS transistor MP31 in common through the node N3.

Figure 10:
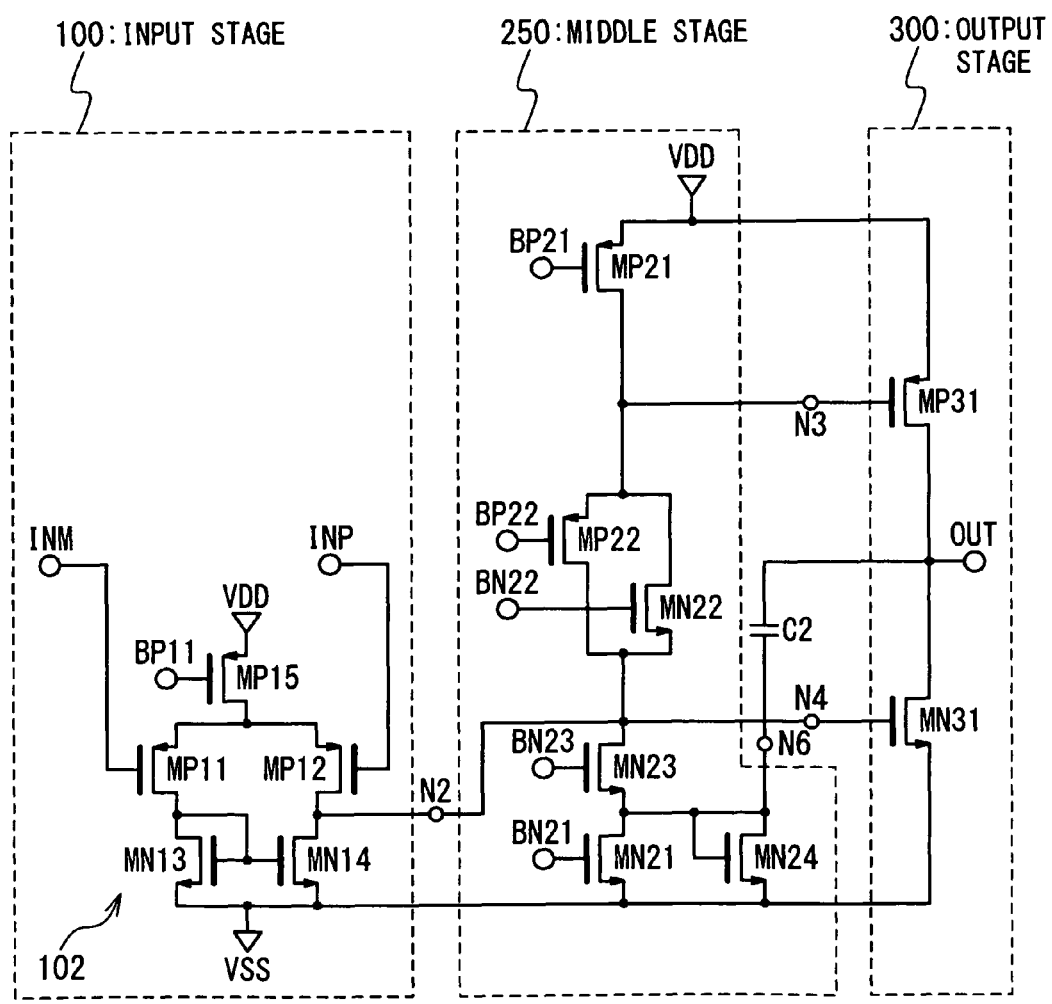
FIG. 10 is a circuit diagram showing a configuration of the class AB amplifier circuit according to another modification of the third embodiment of the present invention.

The class AB amplifier circuit shown in FIG. 10 includes a middle stage circuit 250 that the phase compensation capacitance C2, the N-channel MOS transistor MN23, and the N-channel MOS transistor MN24 are removed from the middle stage circuit 210 in the fourth embodiment. The middle stage circuit 250 and the last stage circuit 300 are connected through the nodes N3, N4, and N5, and the source of the N-channel MOS transistor MN22 and the drain of the N-channel MOS transistor MN21 are connected with the P-channel MOS transistor MP31 in common through the node N3.

In the class AB amplifier circuits shown in FIGS. 7 to 10, the penetrating current due to the phase compensation capacitance is not generated like the first embodiment. Also, in the class AB amplifier circuits shown in FIGS. 8 and 10, like the second and fourth embodiments, the current quantity of the constant current source in the middle stage circuit can be set small because the phase compensation capacitances are charged and discharged by using the P-channel MOS transistor MP24 or The N-channel MOS transistor MN24.

As described above, the class AB amplifier circuit according to the present invention can realize a low power consumption amount while being used as the voltage follower circuit, since the penetrating current with no relation to the charge and discharge of a load can be eliminated unlike the conventional technique. Because the current of the constant current source can be reduced by the P-channel MOS transistor MP24 or the N-channel MOS transistor MN24 for the phase compensation capacitances, the response characteristic of the class AB amplifier circuit can be improved. The low power consumption operation and high speed operation of load driving can be realized while maintaining the shrinkage effect.

Above, the various embodiments of the present invention have been described in detail. However, specific configuration is not limited to the above embodiments and modifications can be made without being depart from the scope of the present invention. Also, two or more of the embodiments may be combined if there is contradiction. The class AB amplifier circuit has been described by taking as an example, voltage follower circuits for driving data lines in a liquid crystal display apparatus.

What is claimed is:

1. A class AB amplifier circuit comprising:
    an input stage circuit comprising a first differential pair configured to receive a differential signal and a first current mirror circuit connected with said first differential pair through a first node;
    an middle stage circuit comprising a floating constant current source connected with said first node, a first transistor whose gate is applied with a bias voltage, and a first constant current source connected with said first node through said first transistor;
    a last stage circuit comprising a first output stage transistor whose gate is connected with said first node and which controls a voltage of an output terminal; and
    a first phase compensation capacitance having one end connected with a first connection node between said first constant current source and said first transistor and the other end connected with said output terminal.

2. The class AB amplifier circuit according to claim 1, wherein said first constant current source is connected with a first power supply, and
    said middle stage circuit further comprises a second transistor that is diode-connected between said first connection node and said first power supply.

3. The class AB amplifier circuit according to claim 1, wherein said middle stage circuit further comprises a second constant current source connected with said floating constant current source through a second node, and
    said last stage circuit further comprises a second output stage transistor whose gate is connected with said second node and which controls the voltage of said output terminal.

4. The class AB amplifier circuit according to claim 3, wherein said middle stage circuit further comprises a third transistor whose gate is applied with a bias voltage, and
    said second constant current source is connected with said second node through said third transistor.

5. The class AB amplifier circuit according to claim 4, further comprising:
    a second phase compensation capacitance having one end connected with a second connection node between said second constant current source and said third transistor and the other end connected with said output terminal.

6. The class AB amplifier circuit according to claim 5, wherein said input stage circuit further comprises:
    a second differential pair configured to receive the differential signal; and
    a second current mirror circuit connected with said second differential pair through said second node.

7. The class AB amplifier circuit according to claim 5, wherein said second constant current source is connected with a second power supply, and
    said middle stage circuit further comprises a fourth transistor that is diode-connected between said second connection node and said second power supply.

8. A display apparatus comprising:
    a class AB amplifier circuit of a voltage follower configuration;
    wherein said class AB amplifier circuit comprises:
        an input stage circuit comprising a first differential pair configured to receive a differential signal and a first current mirror circuit connected with said first differential pair through a first node,
        an middle stage circuit comprising a floating constant current source connected with said first node, a first transistor whose gate is applied with a bias voltage, and a first constant current source connected with said first node through said first transistor,
        a last stage circuit comprising a first output stage transistor whose gate is connected with said first node and which controls a voltage of an output terminal; and
        a first phase compensation capacitance having one end connected with a first connection node between said first constant current source and said first transistor and the other end connected with said output terminal;
    a digital-to-analog converter configured to supply a display signal to a non-inversion input terminal of said amplifier circuit based on one of reference voltages generated by a gray scale voltage generating circuit; and a display panel comprising a pixel capacitance activated in response to a voltage outputted from said class AB amplifier circuit request based on the display signal.

9. The display apparatus according to claim 8, wherein said first constant current source is connected with a first power supply, and said middle stage circuit further comprises a second transistor that is diode-connected between said first connection node and said first power supply.

10. The display apparatus according to claim 8, wherein said middle stage circuit further comprises a second constant current source connected with said floating constant current source through a second node, and said last stage circuit further comprises a second output stage transistor whose gate is connected with said second node and which controls the voltage of said output terminal.

11. The display apparatus according to claim 10, wherein said middle stage circuit further comprises a third transistor whose gate is applied with a bias voltage, and said second constant current source is connected with said second node through said third transistor.

12. The display apparatus according to claim 11, wherein said class AB amplifier circuit further comprises:

a second phase compensation capacitance having one end connected with a second connection node between said second constant current source and said third transistor and the other end connected with said output terminal.

13. The display apparatus according to claim 12, wherein said input stage circuit further comprises:

a second differential pair configured to receive the differential signal; and a second current mirror circuit connected with said second differential pair through said second node.

14. The display apparatus according to claim 12, wherein said second constant current source is connected with a second power supply, and said middle stage circuit further comprises a fourth transistor that is diode-connected between said second connection node and said second power supply.

* * * * *